United States Patent
Cho et al.

(10) Patent No.: US 10,515,761 B1
(45) Date of Patent: Dec. 24, 2019

(54) ELECTRONIC COMPONENT INCLUDING A CAPACITOR ARRAY

(71) Applicant: SAMSUNG ELECTRO-MECHANICS CO., LTD., Suwon-si, Gyeonggi-do (KR)

(72) Inventors: Beom Joon Cho, Suwon-si (KR); Sang Soo Park, Suwon-si (KR); Ki Young Kim, Suwon-si (KR); Woo Chul Shin, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/260,755

(22) Filed: Jan. 29, 2019

Related U.S. Application Data

(63) Continuation-in-part of application No. 16/169,912, filed on Oct. 24, 2018.

(30) Foreign Application Priority Data

Aug. 30, 2018 (KR) .................. 10-2018-0102619
Jan. 11, 2019 (KR) .................. 10-2019-0003755

(51) Int. Cl.
*H01G 4/224* (2006.01)
*H01G 4/38* (2006.01)
(Continued)

(52) U.S. Cl.
CPC ............ *H01G 4/224* (2013.01); *H01G 4/248* (2013.01); *H01G 4/30* (2013.01); *H01G 4/38* (2013.01);
(Continued)

(58) Field of Classification Search
CPC .......... H01G 4/224; H01G 4/248; H01G 4/30; H01G 4/38; H01G 4/012; H01G 4/1227; H01G 4/1245
(Continued)

(56) References Cited

U.S. PATENT DOCUMENTS

| | | | |
|---|---|---|---|
| 2009/0147449 A1* | 6/2009 | Matsuoka | H01G 9/012 361/540 |
| 2010/0188798 A1* | 7/2010 | Togashi | H01G 2/06 361/306.3 |
| 2010/0243307 A1* | 9/2010 | McConnell | H01G 4/232 174/260 |

FOREIGN PATENT DOCUMENTS

| | | |
|---|---|---|
| JP | H07-249541 A | 9/1995 |
| JP | 2014-273935 A | 9/2004 |
| JP | 2012-033660 A | 2/2012 |

* cited by examiner

*Primary Examiner* — Michael P McFadden
(74) *Attorney, Agent, or Firm* — Morgan, Lewis & Bockius LLP

(57) ABSTRACT

An electronic component includes: a capacitor array including a plurality of multilayer capacitors which are sequentially arranged in a first direction, and first and second metal frames disposed on both side surfaces of the capacitor array and connected to first and second external electrodes of the plurality of multilayer capacitors, respectively; the first and second metal frames include first and second support portions, and first and second mounting portions, respectively; and the m first and second mounting portions include first and second portions opposing each other toward the center of the capacitor array, and third and fourth portions positioned outside the first and second portions, respectively, and a length of each of the first and second portions is shorter than a length of each of the third and fourth portions.

8 Claims, 17 Drawing Sheets

(51) Int. Cl.
 *H01G 4/248* (2006.01)
 *H01G 4/30* (2006.01)
 *H01G 4/012* (2006.01)
 *H01G 4/12* (2006.01)
(52) U.S. Cl.
 CPC ........... *H01G 4/012* (2013.01); *H01G 4/1227* (2013.01); *H01G 4/1245* (2013.01)
(58) Field of Classification Search
 USPC ..................................................... 361/321.2
 See application file for complete search history.

ELECTRONIC COMPONENT INCLUDING A CAPACITOR ARRAY

CROSS-REFERENCE TO RELATED APPLICATION(S)

This application is a continuation-in-part of U.S. application Ser. No. 16/169,212 filed Oct. 24, 2018, which claims the benefit of priority to Korean Patent Application No. 10-2018-0102619 filed on Aug. 30, 2018 and Korean Patent Application No. 10-2019-0003755 filed on Jan. 11, 2019, in the Korean Intellectual Property Office, the disclosure of which is incorporated herein by reference in its entirety.

TECHNICAL FIELD

The present disclosure relates to an electronic component.

BACKGROUND

Multilayer capacitors are commonly used in a variety of electronic devices due to being able to be implemented with a small size and high capacity.

In recent years, due to the rapid rise in popularity of environmentally-friendly automobiles and electric vehicles, power driving systems in automobiles have increased, and accordingly, demand for the multilayer capacitors required for automobiles has also increased.

Since a high level of thermal reliability, electrical reliability, and mechanical reliability are required in use as an automotive part, the level of performance required for the multilayer capacitor is also being advanced.

In particular, there is an increasing demand for a modular electronic device having high resistance to vibrations and deformation, while allowing high capacity to be implemented by stacking a plurality of multilayer capacitors in a limited space.

Meanwhile, modular electronic components are being manufactured to be elongated. Therefore, when a modular electronic component is mounted on a substrate, a position of a metal frame is distorted and the metal frame may contact land patterns having different polarities, which may result in a short circuit defect.

SUMMARY

An aspect of the present disclosure may provide an electronic component capable of implementing high capacity, improving durability and reliability against vibration and deformation, and preventing a short circuit when being mounted on a substrate even though it is manufactured in a modular type.

According to an aspect of the present disclosure, an electronic component may include a capacitor array including a plurality of multilayer capacitors which are sequentially arranged in a first direction; a first metal frame disposed on one side surface of the capacitor array and connected to first external electrodes of the plurality of multilayer capacitors; and a second metal frame disposed on the other side surface of the capacitor array and connected to second external electrodes of the plurality of multilayer capacitors, wherein the first metal frame includes a first support portion bonded to first head portions of the first external electrodes and a first mounting portion extending in a second direction perpendicular to the first direction from a lower end of the first support portion, the second metal frame includes a second support portion bonded to second head portions of the plurality of second external electrodes and a second mounting portion extending in the second direction from a lower end of the second support portion, the first and second mounting portions include first and second portions opposing each other in the second direction toward the center of the capacitor array, and third and fourth portions positioned outside the first and second portions in the second direction, respectively, and a length of each of the first and second portions in the first direction is shorter than a length of each of the third and fourth portions in the first direction.

In the first and second mounting portions, first and second cutting portions may be provided at corners of the first and second portions, respectively.

$0 \le b/a \le 0.5$ may be satisfied, in which a is a total area of the first mounting portion including a total area of the first cutting portion or a total area of the second mounting portion including a total area of the second cutting portion, and b is the total area of the first cutting portion or the total area of the second cutting portion.

The first and second portions of the first and second mounting portions may be formed in one of a rectangular shape, a triangular shape, and a trapezoidal shape.

A conductive adhesive portion may be provided between the first external electrodes and the first support portion, and the conductive adhesive portion may be provided between the second external electrodes and the second support portion.

The multilayer capacitor may include a body, and the first and second external electrodes formed on opposite end surfaces m of the body in a second direction, and the body may include a dielectric layer, and first and second internal electrodes alternately disposed while having the dielectric layer interposed therebetween.

The first and second external electrodes may include the first and second head portions formed on the opposite end surfaces of the body in the second direction; and first and second band portions extending from the first and second head portions to portions of upper and lower surfaces of the body and to portions of opposing side surfaces of the body.

A conductive adhesive portion may be provided in the first and second head portions, respectively.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
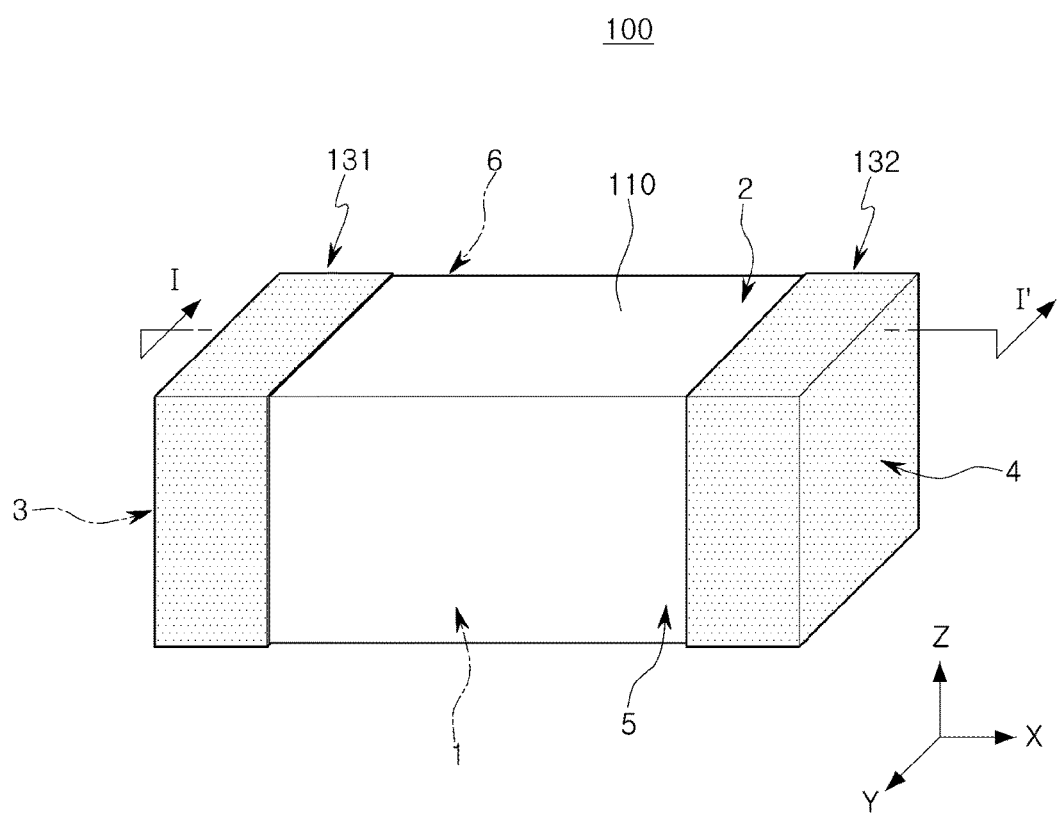
FIG. 1 is a perspective view schematically illustrating a multilayer capacitor applied to an exemplary embodiment in the present disclosure.

Hereinafter, exemplary embodiments of the present disclosure will now be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope m of the claims set forth herein. Similarly, a second element may also be referred to as a first element.

Herein, an upper portion, a lower portion, an upper side, a lower side, an upper surface, a lower surface, and the like, are decided in the accompanying drawings. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Directions will be defined in order to clearly describe exemplary embodiments in the present disclosure. X, Y and Z in the drawings refer to a length direction, a width direction, and a thickness direction of a multilayer capacitor, respectively.

In addition, X, Y, and Z refer to a width direction, length direction, and a thickness direction of a capacitor array, respectively.

Here, the Y direction refers to a stacked direction in which dielectric layers are stacked in the present exemplary embodiment.

Figure 2A:
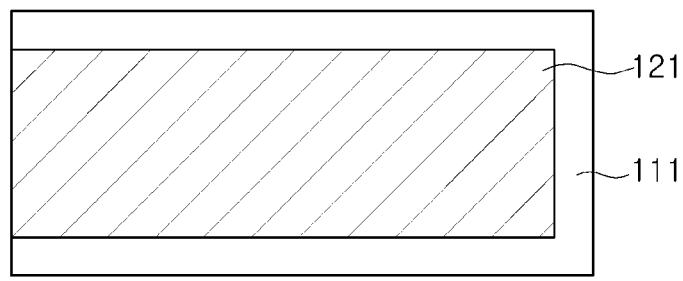
FIGS. 2A and 2B are plan views illustrating first and second internal electrodes applied to the multilayer capacitor of FIG. 1.
Figure 2B:
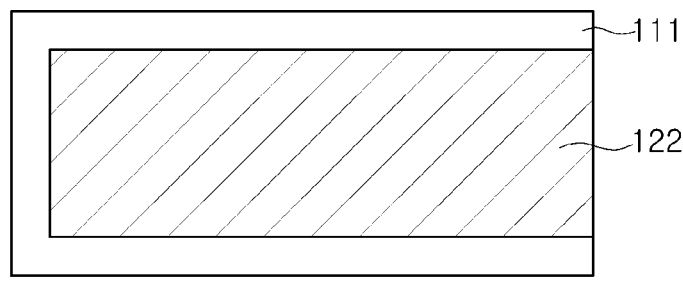
Figure 3:
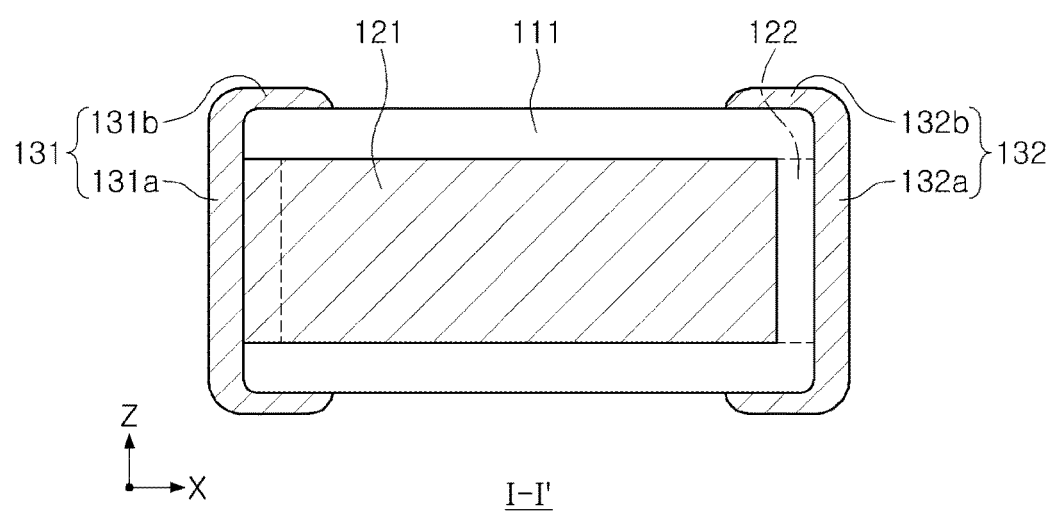
FIG. 3 is a cross-sectional view taken along a line I-I' of FIG. 1.

FIG. 1 is a perspective view schematically illustrating a multilayer capacitor applied to an exemplary embodiment in the present disclosure, FIGS. 2A and 2B are plan views illustrating first and second internal electrodes of the multilayer capacitor of FIG. 1, and FIG. 3 is a cross-sectional view taken along a line I-I' of FIG. 1.

First, a structure of a multilayer capacitor applied to an electronic component according to the present exemplary embodiment will be described with reference to FIGS. 1 through 3.

Referring to FIGS. 1 through 3, a multilayer capacitor 100 according to the present exemplary embodiment may include a body 110, and first and second external electrodes 131 and 132 formed on opposite end surfaces of the body 110, respectively, in an X direction of the body 110.

The body 110 may be formed by stacking a plurality of dielectric layers 111 in a Y direction of the body 110 and then sintering the plurality of dielectric layers 111. The dielectric layers 111 adjacent to each other of the body 110 of the capacitor may be integrated with each other so that boundaries therebetween are not readily apparent without using a scanning electron microscope (SEM).

In addition, the body 110 may include the plurality of dielectric layers 111, and first and second internal electrodes 121 and 122 alternately disposed in a Y direction of the body 110 while having the dielectric layers 111 interposed therebetween and having different polarities.

In addition, the body 110 may include an active region, which is a portion contributing to formation of capacitance of the capacitor, and cover regions provided on left and right portions of the active region in the Y direction of the body 110 and upper and lower portions of the active region in a Z direction of the body 110 as margin portions.

A shape of the body 110 is not particularly limited, but may be a hexahedron shape. The body 110 may have first and second surfaces 1 and 2 opposing each other in the Z direction of the body 110, third and fourth surfaces 3 and 4 connected to the first and second surfaces 1 and 2 and opposing each other in the X direction of the body 110, and fifth and sixth surfaces 5 and 6 connected to the first and second surfaces 1 and 2, connected to the third and fourth surfaces 3 and 4, and opposing each other in the Y direction of the body 110.

The dielectric layer 111 may include a ceramic powder, for example, a $BaTiO_3$ based ceramic powder or the like.

An example of the barium titanate ($BaTiO_3$) based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, and the like, in which Ca, Zr, or the like, is partially dissolved in $BaTiO_3$, but is not limited thereto.

In addition, the dielectric layer 111 may further include a ceramic additive, an organic solvent, a plasticizer, a binder, a dispersant, and the like, in addition to the ceramic powder.

The ceramic additive may include, for example, a transition metal oxide or carbide, a rare earth element, magnesium (Mg), aluminum (Al), or the like.

The first and second internal electrodes 121 and 122, which are electrodes to which different polarities are applied, may be formed on the dielectric layer 111 to be stacked in the Y direction of the body 110, and may be alternately disposed in the body 110 so as to opposite to each other along the Y direction of the body 110 while having one dielectric layer 111 interposed therebetween.

At this time, the first and second internal electrodes 121 and 122 may be electrically insulated from each other by the dielectric layer 111 disposed therebetween.

Meanwhile, the present disclosure illustrates and describes a structure in which the internal electrodes are staked in the Y direction of the body 110, but the present disclosure is not limited thereto and may also be applied to a structure in which the internal electrodes are stacked in the Z direction of the body, if necessary.

One end portion of each of the first and second internal electrodes 121 and 122 may be exposed through the third and fourth surfaces 3 and 4 of the body 110, respectively.

The end portions of the first and second internal electrodes 121 and 122 alternately exposed through the third and m fourth surfaces 3 and 4 of the body 110 may be electrically connected to the first and second external electrodes 131 and 132 disposed on the opposite end surfaces of the body 110 in the X direction of the body 110, respectively, to be described below.

According to the configuration as described above, when a predetermined voltage is applied to the first and second external electrodes 131 and 132, electric charges may be accumulated between the first and second internal electrodes 121 and 122.

At this time, a capacitance of the multilayer capacitor 100 may be in proportional to an overlapping area of the first and second internal electrodes 121 and 122 overlapping with each other along the Y direction of the body 110 in the active region.

In addition, a material forming the first and second internal electrodes 121 and 122 is not particularly limited, but may be a conductive paste formed of one or more of, for example, a noble metal material such as platinum (Pt), palladium (Pd), a palladium-silver (Pd—Ag) alloy, or the like, nickel (Ni), and copper (Cu).

A method of printing the conductive paste may be a screen printing method, a gravure printing method, or the like, but is not limited thereto.

Voltages having different polarities may be provided to the first and second external electrodes 131 and 132, and the first and second external electrodes 131 and 132 may be disposed on the opposite end surfaces of the body 110 in the X direction of the body 110, and may be electrically connected to the exposed portions of the first and second internal electrodes 121 and 122, respectively.

The first external electrode 131 may include a first head portion 131a and a first band portion 131b.

The first head portion 131a may be disposed on the third surface 3 of the body 110, and may be in contact with the end portion of the first internal electrode 121 exposed to the outside through the third surface 3 of the body 110 to serve to electrically connect the first internal electrode 121 and the first external electrode 131 to each other.

The first band portion 131b may be a portion extending from the first head portion 131a to portions of the first, second, fifth, and sixth surfaces 1, 2, 5, and 6 of the body 110 to improve fixing strength.

The second external electrode 132 may include a second head portion 132a and a second band portion 132b.

The second head portion 132a may be disposed on the fourth surface 4 of the body 110, and may be in contact with the end portion of the second internal electrode 122 exposed to the outside through the fourth surface 4 of the body 110 to serve to electrically connect the second internal electrode 122 and the second external electrode 132 to each other.

The second band portion 132b may be a portion extending from the second head portion 132a to portions of the first, second, fifth, and sixth surfaces 1, 2, 5, and 6 of the body 110 to improve fixing strength.

Meanwhile, the first and second external electrodes 131 and 132 may further include a plating layer.

The plating layer may include first and second nickel (Ni) plating layers, and first and second tin (Sn) plating layers covering the first and second Ni plating layers, respectively.

Figure 4:
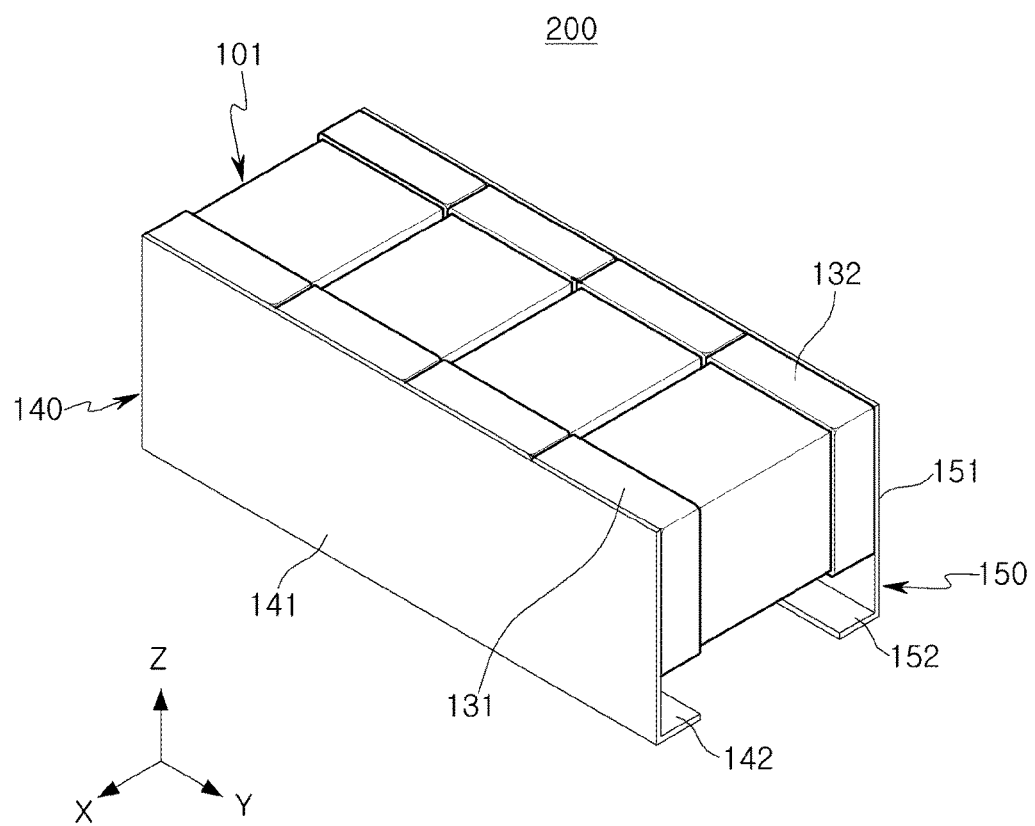
FIG. 4 is a perspective view illustrating a schematic structure of an electronic component according to an exemplary embodiment in the present disclosure.
Figure 5:
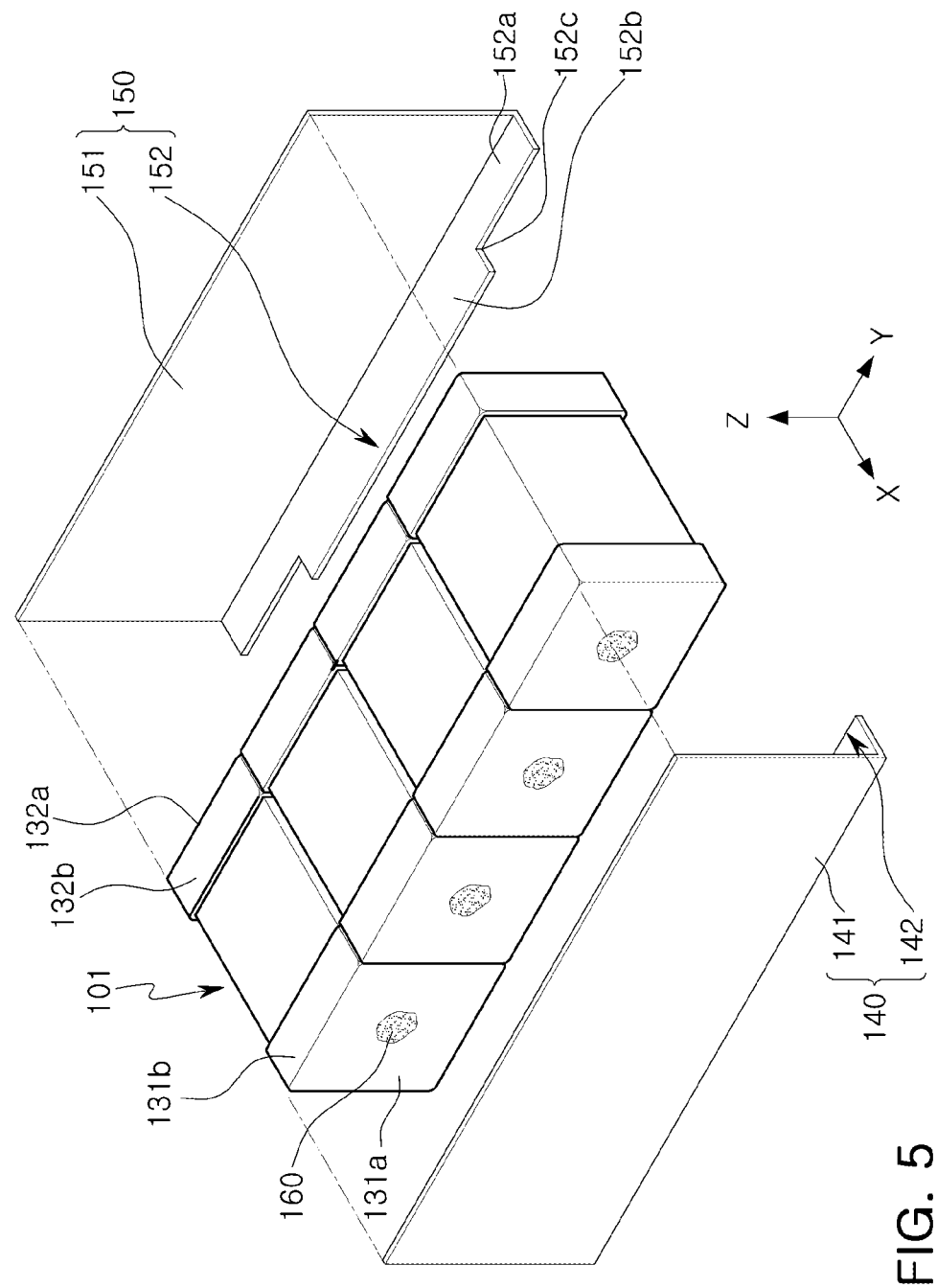
FIG. 5 is an exploded perspective view of the electronic component of FIG. 4.
Figure 6:
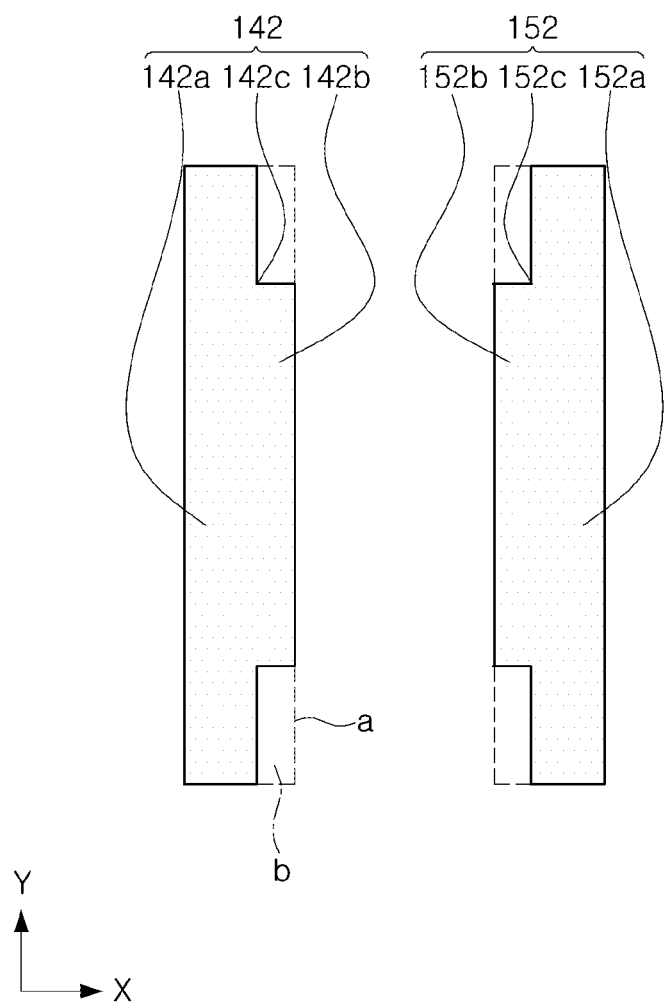
FIG. 6 is a plan view illustrating first and second mounting portions of first and second metal frames in the electronic component of FIG. 4.

FIG. 4 is a perspective view illustrating a schematic structure of an electronic component according to an exemplary embodiment in the present disclosure, FIG. 5 is an exploded perspective view of the electronic component of FIG. 4, and FIG. 6 is a plan view illustrating first and second mounting portions of first and second metal frame in the electronic component of FIG. 4.

Referring to FIGS. 4 through 6, an electronic component 200 according to the present exemplary embodiment may include a capacitor array 101 including a plurality of multilayer capacitors 100 which are sequentially arranged in a first direction, e.g., the Y direction, a first metal frame 140 disposed on one side surface of the capacitor array 101 in an X direction thereof and connected to the first external electrode 131 of each of the plurality of multilayer capacitors 100, and a second metal frame 150 disposed on the other side surface of the capacitor array 101 in a second direction, e.g., the X direction, thereof and connected to the second external electrode 132 of each of the plurality of multilayer capacitors 100.

The first metal frame 140 may be bonded to the respective first external electrodes 131 of the plurality of multilayer capacitors 100 to serve as a common electrode connecting the first external electrodes 131 of adjacent multilayer capacitors 100 to each other.

Such a first metal frame 140 may include a first support portion 141 and a first mounting portion 142.

The first support portion 141 may be a portion which is perpendicular to a mounting surface, is elongated in the Y direction, and is bonded to the respective first head portions 131a of the plurality of first external electrodes 131, and may electrically and physically connect the first head portions 131a of the plurality of first external electrodes 131 to each other.

In addition, a length of the first support portion 141 in the Y direction may be set to be substantially similar to a total length of the capacitor array 101 in the Y direction so that the first support portion 141 may be connected to the first external electrodes 131 of all the multilayer capacitors 100.

A conductive adhesive portion 160 may be provided between the first external electrodes 131 and the first support portion 141.

According to the present exemplary embodiment, the conductive adhesive portion 160 may be provided in the respective first head portions 131a of the first external electrodes 131.

Such a conductive adhesive portion 160 may be formed of a high temperature solder, a conductive adhesive material, or the like, but is not limited thereto.

The first mounting portion 142 may be a portion extending in the second direction, e.g., the X direction, perpendicular to the first direction from a lower end of the first support portion 141 and formed to be horizontal with respect to the mounting surface, and may serve as a connection terminal at the time of mounting the substrate.

In addition, the first mounting portion 142 may be disposed to be spaced apart from a lower surface of the multilayer capacitor 100 by a predetermined distance in the Z direction.

Such a first mounting portion 142 may include a first portion 142b close to the center of the capacitor array 101 in the X direction, and a third portion 142a far from the center of the capacitor array 101 in the X direction.

In addition, a first cutting portion 142c may be formed at each of opposite corners of the first portion 142b.

Therefore, a length of the first portion 142b in the Y direction may be shorter than a length of the third portion 142a in the Y direction.

The first portion 142b may be formed in a substantially rectangular shape.

The second metal frame 150 may be bonded to the respective second external electrodes 132 of the plurality of multilayer capacitors 100 to serve as a common electrode connecting the second external electrodes 132 adjacent to each other to each other.

Such a second metal frame 150 may include a second support portion 151 and a second mounting portion 152.

The second support portion 151 may be a portion which is perpendicular to a mounting surface, is elongated in the Y direction, and is bonded to the respective second head portions 132a of the plurality of second external electrodes 132, and may electrically and physically connect the second head portions 132a of the plurality of second external electrodes 132 to each other.

In addition, a length of the second support portion 151 in the Y direction may be set to be substantially similar to a total length of the capacitor array 101 in the Y direction so that the second support portion 151 may be connected to the second external electrodes 132 of all the multilayer capacitors 100.

At this time, a conductive adhesive portion 160 may be provided between the second external electrodes 132 and the second support portion 151.

According to the present exemplary embodiment, the conductive adhesive portion 160 may be provided in the second head portions 132a of the second external electrodes 132.

Such a conductive adhesive portion 160 may be formed of a high temperature solder, a conductive adhesive material, or the like, but is not limited thereto.

The second mounting portion 152 may be a portion extending in the second direction, e.g. the X direction, perpendicular to the first direction, from a lower end of the second support portion 151 and formed to be horizontal with respect to the mounting surface, and may serve as a connection terminal at the time of mounting the substrate.

In addition, the second mounting portion 152 may be disposed to be spaced apart from a lower surface of the multilayer capacitor 100 by a predetermined distance in the Z direction.

Such a second mounting portion 152 may include a second portion 152b close to the center of the capacitor array 101 in the X direction, and a fourth portion 152a far from the center of the capacitor array 101 in the X direction.

In addition, a second cutting portion 152c may be formed at each of opposite corners of the second portion 152b.

Therefore, a length of the second portion 152b in the Y direction may be shorter than a length of the fourth portion 152a in the Y direction.

The second portion 152b may be formed in a substantially rectangular shape.

A multilayer capacitor according to the related art has a structure in which a capacitor body and a substrate are indirect contact with each other by a solder when being mounted on the substrate. Here, since heat or mechanical deformation generated in the substrate is directly transferred to the multilayer capacitor, it is difficult to secure a high level of reliability.

In the electronic component according to the present exemplary embodiment, since the plurality of multilayer capacitors 100 are formed of an integrated capacitor array 101, m a high capacitance may be implemented, and thermal reliability and mechanical reliability of the electronic component 200 may be improved by preventing stress from the substrate from being directly transferred to the respective multilayer capacitors 100 when the electronic component 200 is mounted on the substrate by bonding the first and second metal frames 140 and 150 to the opposing side surfaces of the capacitor array 101 to secure an interval between the capacitor array 101 and the substrate.

Meanwhile, in the case of a modular electronic component including the capacitor array, when a position and a direction of the modular electronic component at the time of mounting the modular electronic component on the substrate are deviated from regular position and direction on the design, an end portion of the metal frame is in contact with land patterns having different polarities due to an extended length of the metal frame, which tends to result in a short circuit defect.

In the electronic component 200 according to the present exemplary embodiment, the first and second mounting portions 142 and 152 of the first and second metal frames 140 and 150 may have the first and second cutting portions 142c and 152c. Therefore, even though the first and second metal frames 140 and 150 are distorted at a predetermined angle when the electronic component 200 is mounted on the substrate, a short circuit defect caused at the time of mounting the electronic component 200 on the substrate may be prevented by preventing the first or second mounting portion 142 or 152 from being in contact with the land patterns having different polarities.

Meanwhile, in a case in which sizes of the first and second cutting portions 142c and 152c in the first and second mounting portions 142 and 152 are excessively increased, since bonded areas between the first and second mounting portions 142 and 152 and the land patterns of the substrate are reduced as much as the sizes of the first and second cutting portions 142c and 152c, fixing strength may be lowered.

Therefore, according to the present exemplary embodiment, in order to secure a predetermined level of fixing strength, the sizes of the cutting portions are limited.

Figure 13:
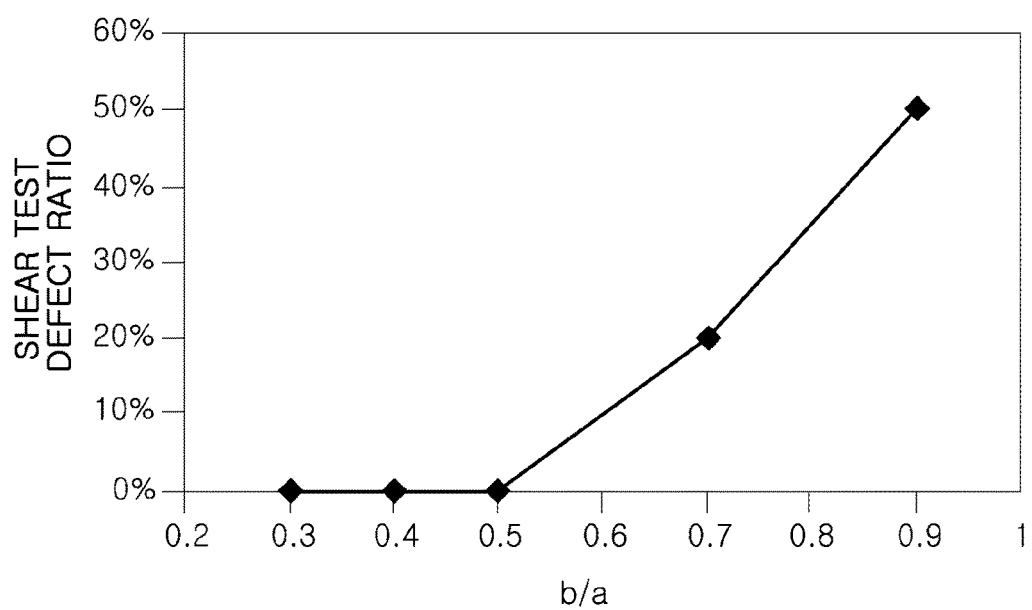
FIG. 13 is a graph illustrating a shear test result according to a ratio of a total area of a cutting portion to a total area of a mounting portion, including the total area of the cutting portion.

FIG. 13 is a graph illustrating a shear test result according to a ratio of a total area of a cutting portion to a total area of a mounting portion, including the total area of the cutting portion.

Referring to FIG. 6, in FIG. 13, a denotes a total area of a first mounting portion 142 including a total area of a first cutting portion 142c or a total area of a second mounting portion 152 including a total portion of the second cutting portion 152c, and b denotes the total area of the first cutting portions 142c or the total area of the second cutting portions 152c.

That is, a may denote a sum of the areas of the first portion 142b, the third portion 142a, and both first cutting portions 142c in the first mounting portion 142, or a sum of the areas of the m second portion 152b, the fourth portion 152a, and both second cutting portions 152c in the second mounting portion 152.

In the shear test, ten electronic components with b/a of 0.3, 0.4, 0.5, 0.7, and 0.9 were mounted on the PCB, and a force of 20 N was then applied at a speed of 1 mm/min for 10 seconds to evaluate whether or not the components were detached.

Referring to FIG. 13, in a case in which b/a is greater than 0.5, the area of a horizontal mounting portion is too small, so that the fixing strength by the solder may not be sufficiently secured, and it may be seen that defective results are obtained as a result of the shear test.

In addition, when b/a is less than or equal to 0.5, the area of the horizontal mounting area is large enough to secure the fixing strength by the solder, and no defect occurred as a result of the shear test.

Therefore, the range of b/a in which the fixing strength may be sufficiently secured may be 0≤b/a≤0.5.

Figure 7:
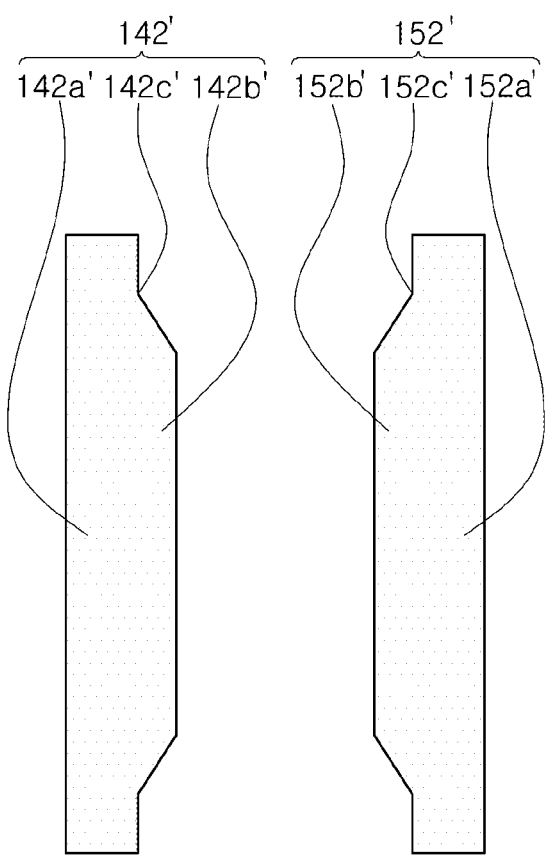
FIG. 7 is a plan view illustrating another example of the first and second mounting portions according to the present disclosure.

FIG. 7 is a plan view illustrating another example of the first and second mounting portions according to the present disclosure.

Referring to FIG. 7, in a first mounting portion 142' according to the present exemplary embodiment, a third portion 142a' is not much different from the third portion according to the exemplary embodiment described above.

In addition, a first mounting portion 142' may have a first portion 142b' formed in a substantially trapezoidal shape.

In a second mounting portion 152', a fourth portion 152a' is not much different from the fourth portion according to the exemplary embodiment described above.

In addition, a second mounting portion 152' may have a second portion 152b' formed in a substantially trapezoidal shape.

Therefore, according to the present exemplary embodiment, since the total area of the mounting portions is smaller than that of the above-described exemplary embodiment, the fixing strength when the electronic component is mounted on the substrate is somewhat weakened. However, an effect of preventing the short circuit defect may be further improved in a case in which the electronic component is distorted when being mounted on the substrate.

Figure 8:
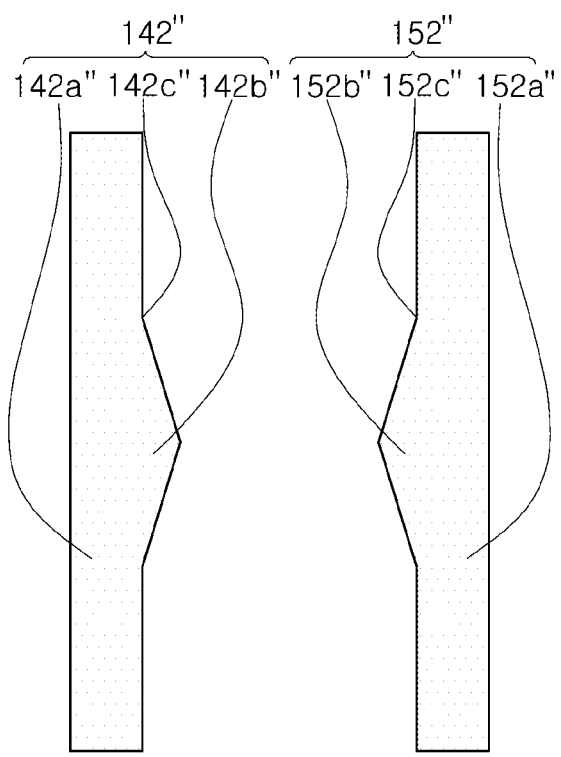
FIG. 8 is a plan view illustrating another example of the first and second mounting portions according to the present disclosure.

FIG. 8 is a plan view illustrating another example of the first and second mounting portions according to the present disclosure.

Referring to FIG. 8, in a first mounting portion 142" according to the present exemplary embodiment, a third portion 142a" is not much different from the third portion according to the exemplary embodiment described above.

In addition, a first mounting portion 142" may have a first portion 142b" formed in a substantially triangular shape.

In a second mounting portion 152", a fourth portion 152a" is not much different from the fourth portion according to the exemplary embodiment described above.

In addition, a second mounting portion 152" may have a second portion 152b" formed in a substantially triangular shape.

Therefore, according to the present exemplary embodiment, since the total area of the mounting portions is smaller than those of the above-described two exemplary embodiments, the fixing strength when the electronic component is mounted on the substrate is the weakest. However, an effect of preventing the short circuit defect may be the highest in a case in which the electronic component is distorted when being mounted on the substrate.

Figure 9A:
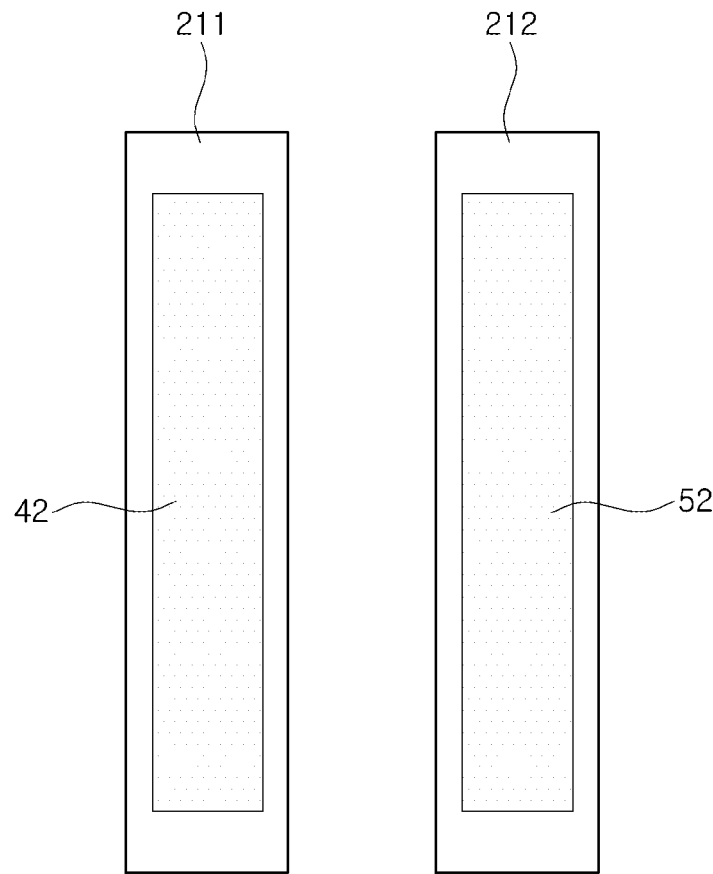
FIGS. 9A and 9B are plan views illustrating a state in which a mounting portion is bonded to a land pattern of a substrate without being distorted and a state in which the mounting portion is bonded to the land pattern of the substrate while being distorted at a predetermined angle in an electronic component including the conventional mounting portion of a rectangular shape without having the cutting portion, respectively.
Figure 9B:
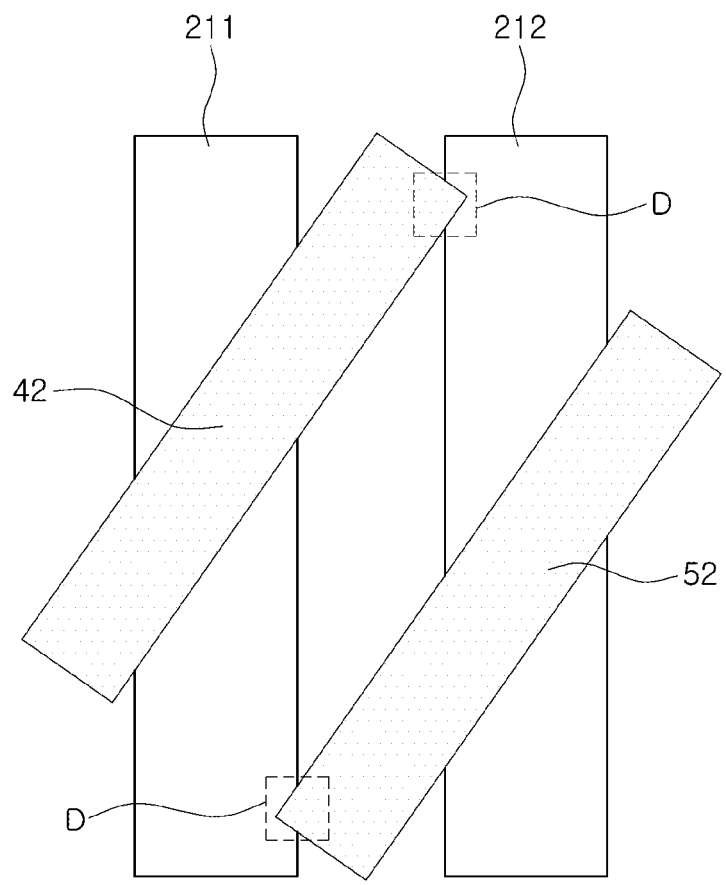

FIGS. 9A and 9B are plan views illustrating a state in which a mounting portion is bonded to a land pattern of a substrate without being distorted and a state in which the mounting portion is bonded to the land pattern of the substrate while being distorted at a predetermined angle in an electronic component including the conventional mounting portion of a rectangular shape without having the cutting portion, respectively.

Referring to FIG. 9A, in a case in which first and second mounting portions 42 and 52 are mounted and bonded onto first and second land patterns 211 and 212 without being distorted, the short circuit problem does not occur. However, as illustrated in FIG. 9B, in a case in which the first and second mounting portions 42 and 52 are unintendedly bonded to the first and second land patterns 211 and 212 while being distorted at a predetermined angle when the electronic component is mounted on the substrate, an end of the first mounting portion 42 is in contact with a portion m of the second land pattern 212 and an end of the second mounting portion 52 is in contact with a portion of the first land pattern 211. As a result, the short circuit defect D may occur.

Figure 10A:
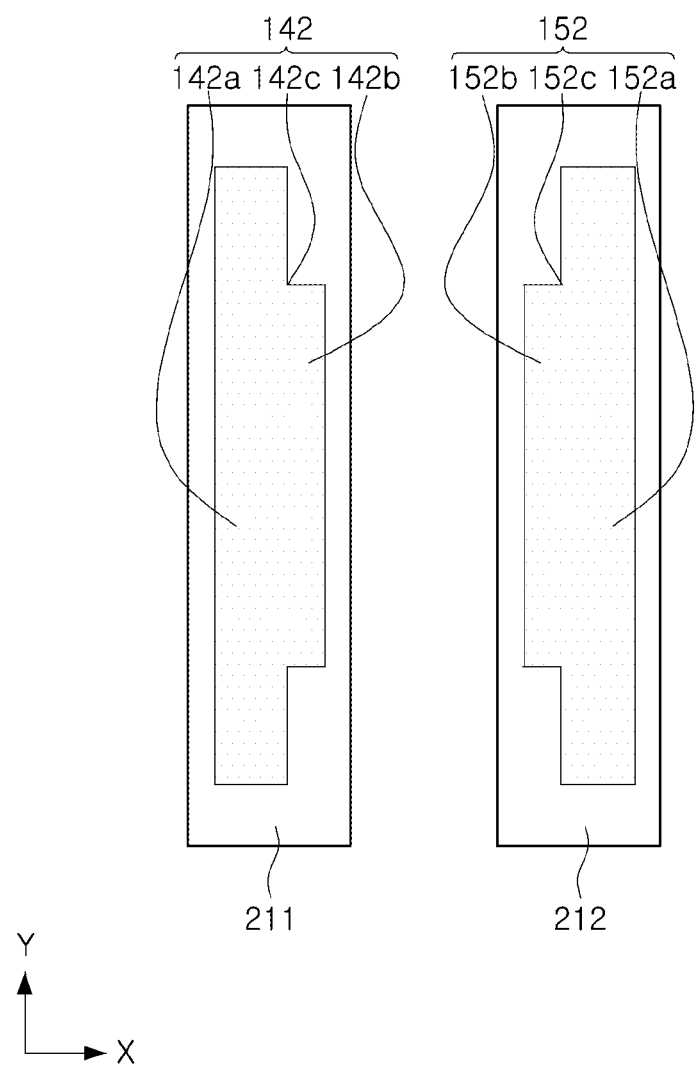
FIGS. 10A and 10B are plan views illustrating a state in which a mounting portion is bonded to a land pattern of a substrate without being distorted and a state in which the mounting portion is bonded to the land pattern of the substrate while being distorted at a predetermined angle in an electronic component including the mounting portions of FIG. 6, respectively.
Figure 10B:
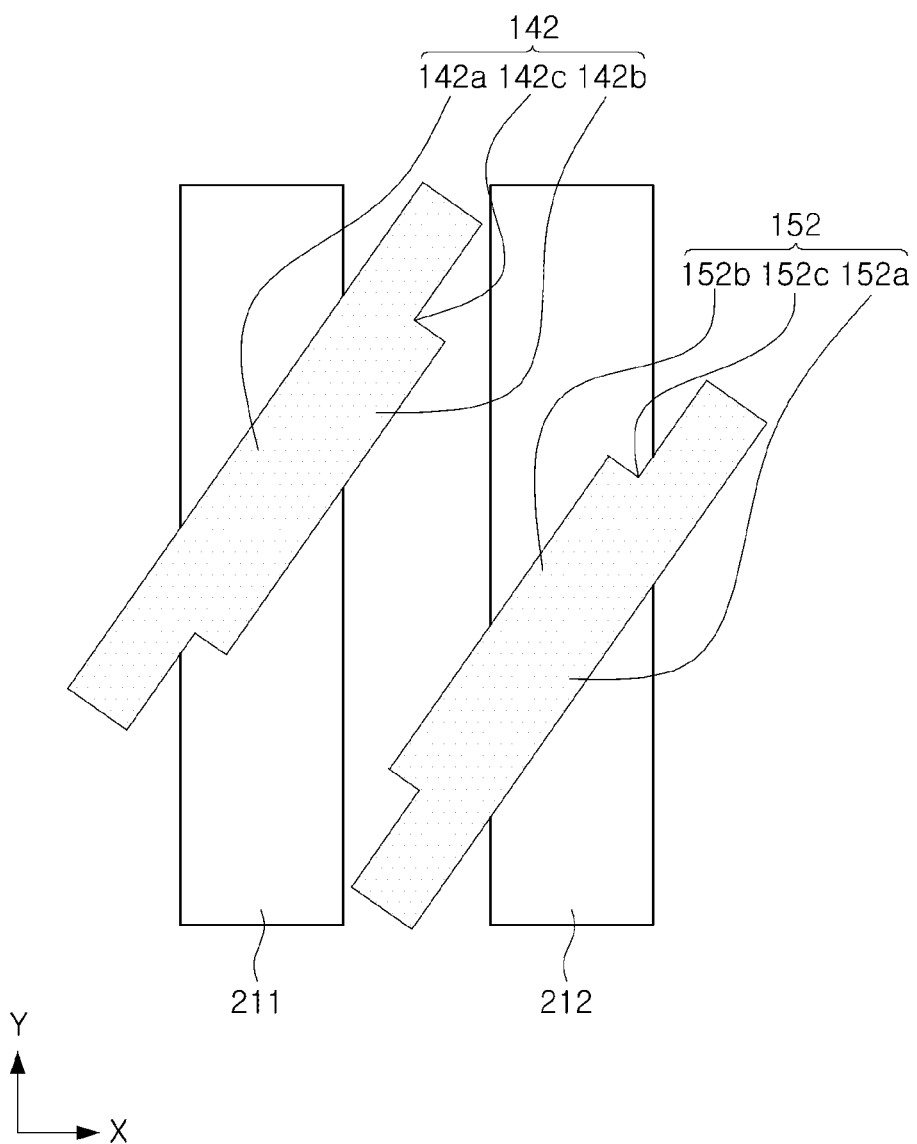

FIGS. 10A and 10B are plan views illustrating a state in which a mounting portion is bonded to a land pattern of a substrate without being distorted and a state in which the mounting portion is bonded to the land pattern of the substrate while being distorted at a predetermined angle in an electronic component including the mounting portions of FIG. 6, respectively.

Referring to FIG. 10A, in a case in which the first and second mounting portions 142 and 152 are mounted and bonded onto the first and second land patterns 211 and 212 without being distorted, the short circuit problem does not occur. As illustrated in FIG. 10B, even though the first and second mounting portions 142 and 152 are bonded to the first and second land patterns 211 and 212 while being distorted at a predetermined angle, an end of the first portion 142b of the first mounting portion 142 may not be in contact with the second land pattern 212 by the first cutting portion 142c and an end of the second portion 152b of the second mounting portion 152 may not be in contact with the first land pattern 211 by the second cutting portion 152c. As a result, the short circuit defect may be avoided.

Figure 11A:
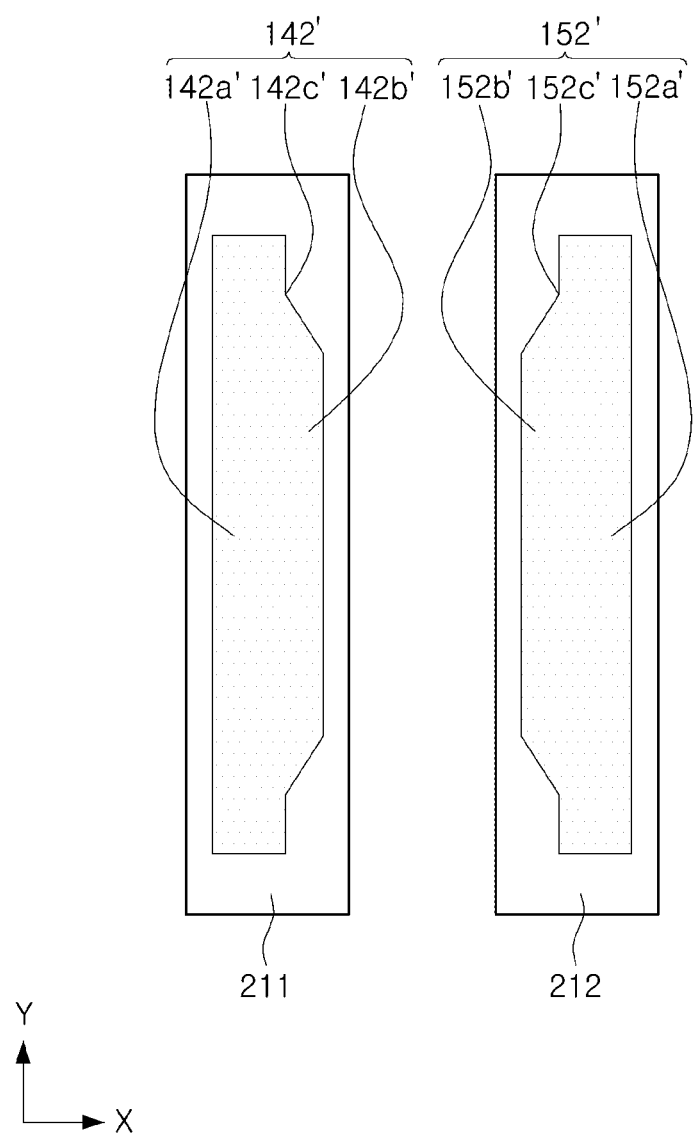
FIGS. 11A and 11B are plan views illustrating a state in which a mounting portion is bonded to a land pattern of a substrate without being distorted and a state in which the mounting portion is bonded to the land pattern of the substrate while being distorted at a predetermined angle in an electronic component including the mounting portions of FIG. 7, respectively.
Figure 11B:
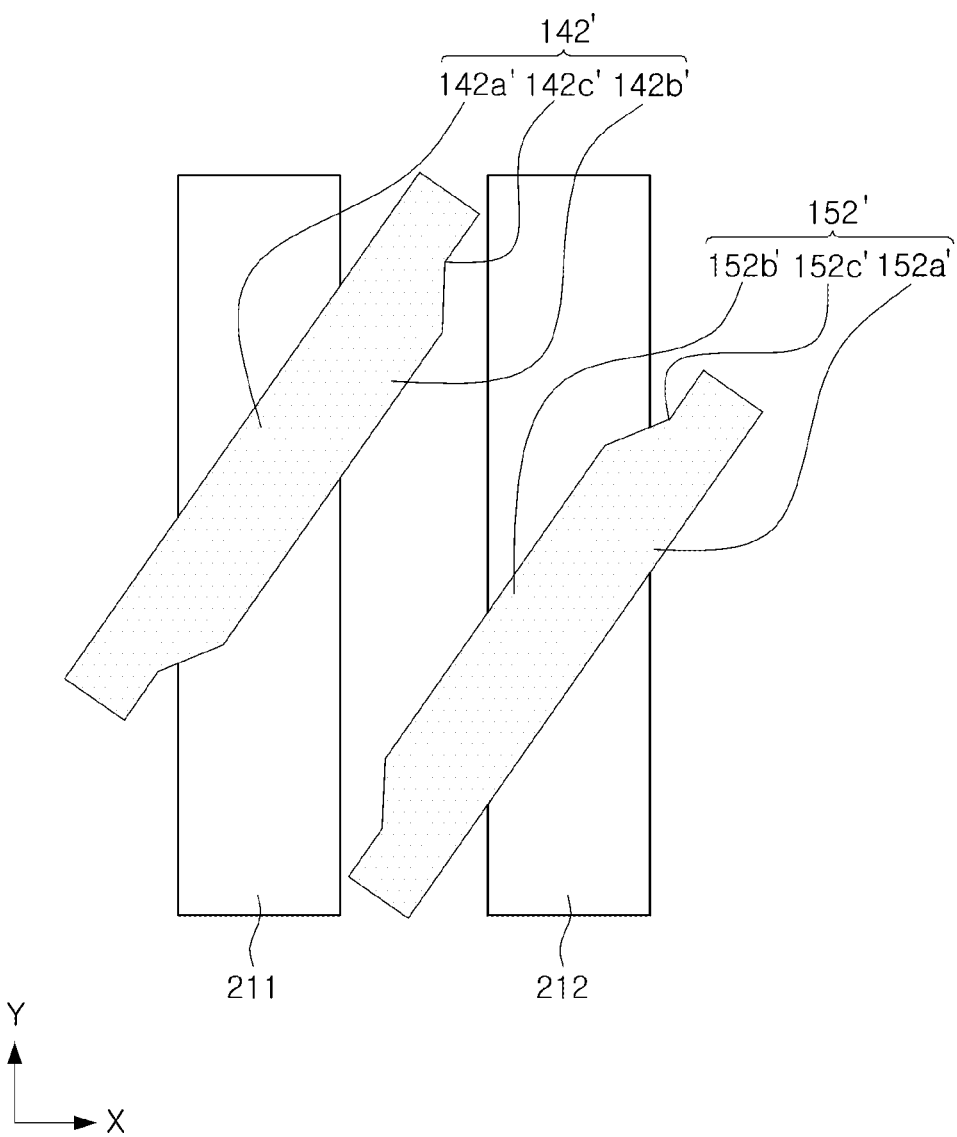

FIGS. 11A and 11B are plan views illustrating a state in which a mounting portion is bonded to a land pattern of a substrate without being distorted and a state in which the mounting portion is bonded to the land pattern of the substrate while being distorted at a predetermined angle in an electronic component including the mounting portions of FIG. 7, respectively.

Referring to FIG. 11A, in a case in which the first and second mounting portions 142' and 152' are mounted and bonded onto the first and second land patterns 211 and 212 without being distorted, the short circuit problem does not occur. As illustrated in FIG. 11B, even though the first and second mounting portions 142' and 152' are bonded to the first and second land patterns 211 and 212 while being distorted at a predetermined angle, an end of the first portion 142b' of the first mounting portion 142' may not be in contact with the second land pattern 212 by the first cutting portion 142c' and an end of the second portion 152b' of the second mounting portion 152' may not be in contact with the first land pattern 211 by the second cutting portion 152c'. As a result, the short circuit defect may be avoided.

Figure 12A:
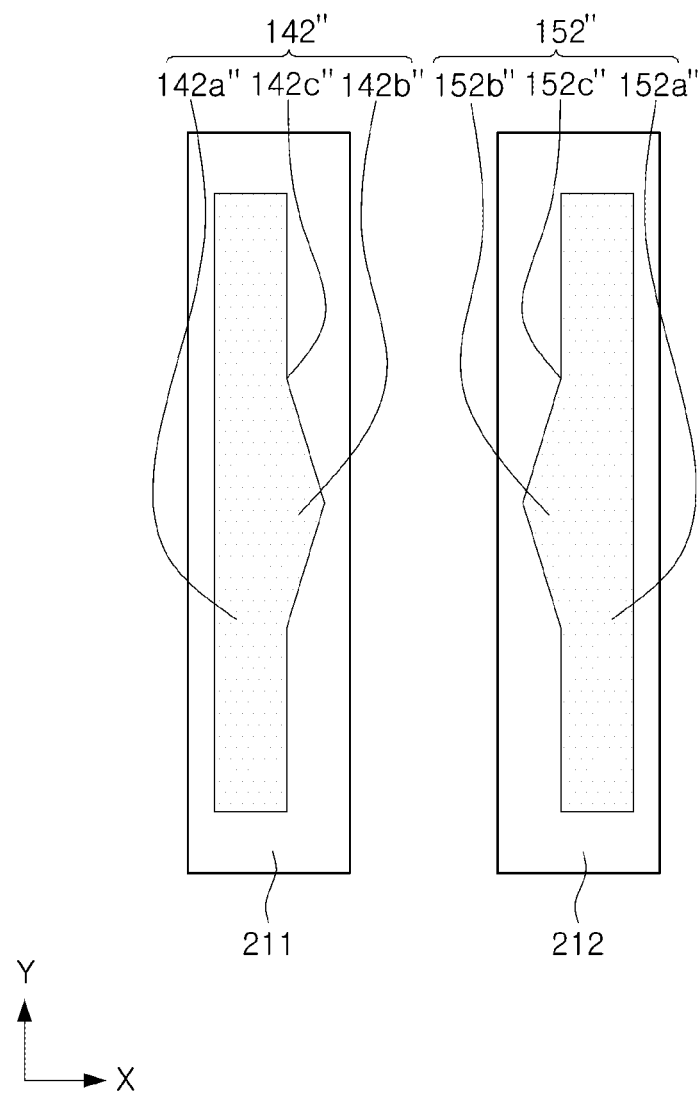
FIGS. 12A and 12B are plan views illustrating a state in which a mounting portion is bonded to a land pattern of a substrate without being distorted and a state in which the mounting portion is bonded to the land pattern of the substrate while being distorted at a predetermined angle in an electronic component including the mounting portions of FIG. 8, respectively.
Figure 12B:
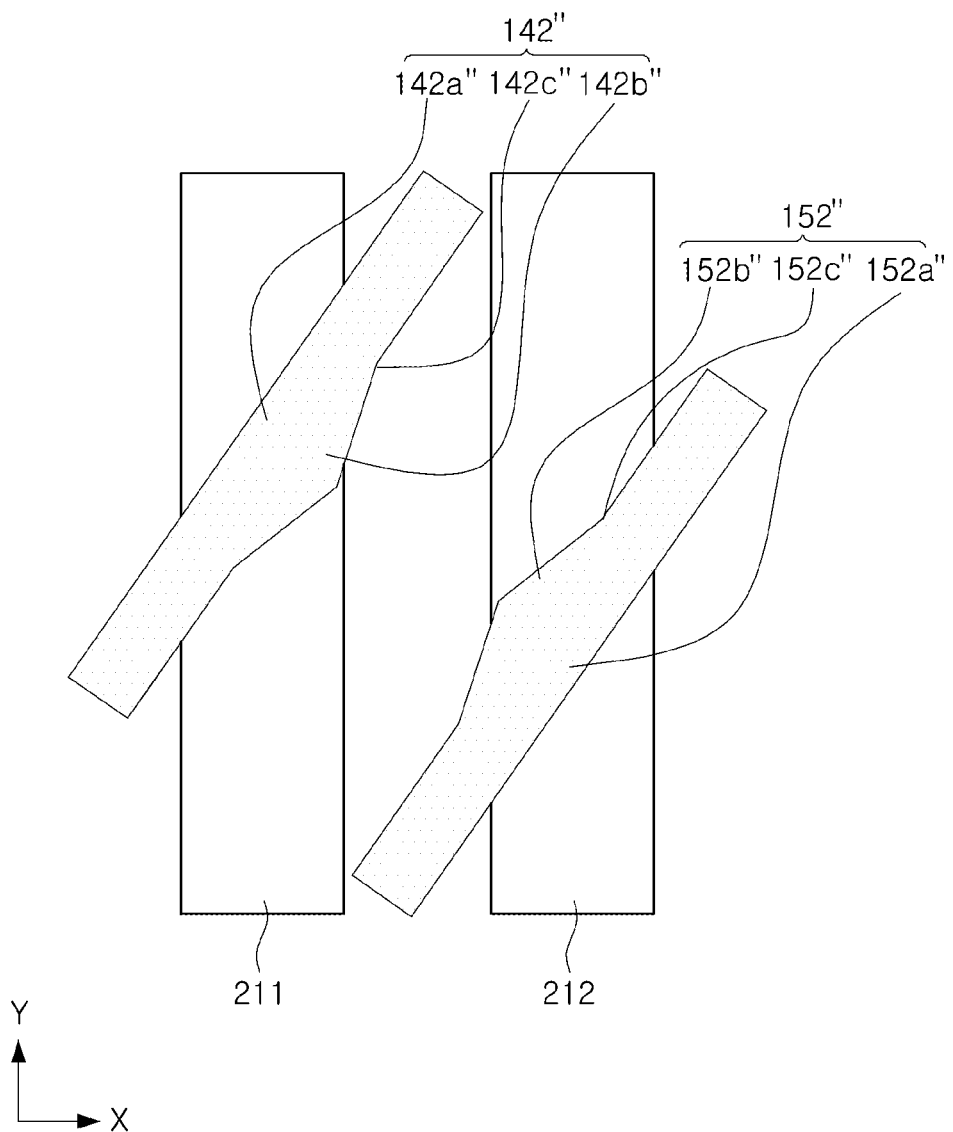

FIGS. 12A and 12B are plan views illustrating a state in which a mounting portion is bonded to a land pattern of a substrate without being distorted and a state in which the mounting portion is bonded to the land pattern of the substrate while being distorted at a predetermined angle in an electronic component including the mounting portions of FIG. 8, respectively.

Referring to FIG. 12A, in a case in which the first and second mounting portions 142" and 152" are mounted and bonded onto the first and second land patterns 211 and 212 without being distorted, the short circuit problem does not occur. As illustrated in FIG. 12B, even though the first and second mounting portions 142" and 152" are bonded to the first and second land patterns 211 and 212 while being distorted at a predetermined angle, an end of the first portion 142b" of the first mounting portion 142" may not be in contact with the second land pattern 212 by the first cutting portion 142c" and an end of the second portion 152b" of the second mounting portion 152" may not be in contact with the first land pattern 211 by the second cutting portion 152c". As a result, the short circuit defect may be avoided.

As set forth above, according to the exemplary embodiment in the present disclosure, the high capacity electronic component which is manufactured in the modular type, may be provided, the durability and reliability against vibration and deformation of the electronic component may be improved, and even though the position of the metal frame is distorted when the electronic component is mounted on the substrate, the short circuit defect may be prevented.

While exemplary embodiments have been shown and described above, it will be apparent to those skilled in the art that modifications and variations could be made without departing from the scope of the present invention as defined by the appended claims.

What is claimed is:

1. An electronic component comprising:
 a capacitor array including a plurality of capacitors which are sequentially arranged in a first direction;
 a first metal frame disposed on a first side surface of the capacitor array and connected to first external electrodes of the plurality of capacitors; and
 a second metal frame disposed on a second side surface opposing the first side surface of the capacitor array and connected to second external electrodes of the plurality of capacitors,
 wherein the first metal frame includes a first support portion bonded to first head portions of the first external electrodes and a first mounting portion extending in a second direction perpendicular to the first direction from a lower end of the first support portion,
 the second metal frame includes a second support portion bonded to second head portions of the second external electrodes and a second mounting portion extending in the second direction from a lower end of the second support portion,
 the first and second mounting portions include first and second portions which are centrally arranged in the first direction and opposing each other in the second direction toward the center of the capacitor array, and third and fourth portions positioned outside the first and second portions in the second direction, respectively,
 a length of each of the first and second portions in the first direction is shorter than a length of each of the third and fourth portions in the first direction,
 wherein in the first and second mounting portions, first and second cutting portions are provided at corners of the first and second portions, respectively, and
 wherein $0 \leq b/a \leq 0.5$ in which a is a total area of the first mounting portion including a total area of the first cutting portion or a total area of the second mounting portion including a total area of the second cutting portion, and b is the total area of the first cutting portion or the total area of the second cutting portion.

2. The electronic component of claim 1, wherein the first and second portions of the first and second mounting portions are formed in one of a rectangular shape, a triangular shape, and a trapezoidal shape.

3. The electronic component of claim 1, wherein a conductive adhesive portion is provided between the first external electrodes and the first support portion, and
 the conductive adhesive portion is provided between the second external electrodes and the second support portion.

4. The electronic component of claim 1, wherein the capacitor includes a body, and the first and second external electrodes formed on opposite end surfaces of the body in the second direction, and
 the body includes a dielectric layer, and first and second internal electrodes alternately disposed while having the dielectric layer interposed therebetween.

5. The electronic component of claim 4, wherein the first and second external electrodes include the first and second head portions formed on the opposite end surfaces of the body in the second direction, and first and second band portions extending from the first and second head portions to portions of upper and lower surfaces of the body and to portions of opposing side surfaces of the body.

6. The electronic component of claim 5, wherein a conductive adhesive portion is provided in the first and second head portions, respectively.

7. A mounting frame for mounting a capacitor component, the mounting frame comprising:
 a first metal frame including a first support portion in a first plane and a first mounting portion extending from an edge of the first support portion in a second plane perpendicular to the first plane, the first mounting portion comprising a first central portion and a third outward portion positioned at each end of the first central portion and having a width smaller than that of the first central portion; and a second metal frame including a second support portion in a third plane parallel to the first plane and a second mounting portion extending from an edge of the second support portion in the second plane and towards the first mounting portion, the second mounting portion comprising a second central portion spaced apart from the first central portion and a fourth outward portion positioned at each end of the second central portion and having a width smaller than that of the second central portion, wherein the width of the first through fourth portions is measured in a first direction extending from the first plane to the third plane, the first metal frame and the second metal frame are separated in the first direction to accommodate an array of capacitors to be disposed such that first external electrodes of the capacitors directly contact the first support portion and the second external electrodes of the capacitors directly contact the second support portion, wherein the first and second mounting portions respectively include first and second cut portions positioned at corners of the respective first and second central portions, and wherein $0 \leq b/a \leq 0.5$ in which a is a total area of the first mounting portion including a total area of the first cutting portion or a total area of the second mounting portion including a total area of the second cutting portion, and b is the total area of the first cutting portion or the total area of the second cutting portion.

8. The mounting frame of claim 7, wherein the first and second central portions are faulted in one of a rectangular shape, a triangular shape, and a trapezoidal shape.

\* \* \* \* \*